United States Patent [19]
Jang et al.

[11] Patent Number: 5,904,573
[45] Date of Patent: May 18, 1999

[54] PE-TEOS PROCESS

[75] Inventors: Syun-Ming Jang; Lung Chen; Chen-Hua D.. Yu, all of Hsin-Chu, Taiwan

[73] Assignee: Taiwan Semiconductor Manufacturing Company, Ltd., Hsin-Chu, Taiwan

[21] Appl. No.: 08/620,182

[22] Filed: Mar. 22, 1996

[51] Int. Cl.⁶ .............................................. H01L 21/316
[52] U.S. Cl. ...................... 438/758; 438/787; 438/788; 438/789; 438/758
[58] Field of Search .................................. 438/787, 788, 438/789, 758, 790

[56] References Cited

U.S. PATENT DOCUMENTS

| | | | |
|---|---|---|---|
| 5,108,843 | 4/1992 | Ohtaka et al. | 428/446 |
| 5,286,523 | 2/1994 | Matsuda et al. | 427/248.1 |
| 5,332,467 | 7/1994 | Sune et al. | 156/636 |
| 5,356,722 | 10/1994 | Nguyen et al. | 427/569 |
| 5,374,847 | 12/1994 | Araki et al. | 257/639 |
| 5,626,678 | 5/1997 | Sahin et al. | 118/723 E |
| 5,635,425 | 6/1997 | Chen | 438/631 |
| 5,716,890 | 2/1998 | Yao | 438/624 |
| 5,723,377 | 3/1998 | Torii | 438/303 |

OTHER PUBLICATIONS

S. Wolf, "Silicon Processing for the VLSI Era–vol.2" Lattice Press, Sunset Beach, CA, pp.194–199 No Date.

*Primary Examiner*—Charles Bowers
*Assistant Examiner*—Thanh Nguyen
*Attorney, Agent, or Firm*—George O. Saile; Stephen B. Ackerman

[57] ABSTRACT

An improvement in the properties of etch rate, mechanical stress, and chemical resistance of silicon layers obtained by plasma-enhanced chemical vapor deposition from mixtures of reactive gases such as oxygen and tetraethoxysilane is achieved by adding nitrogen gas to the reactive gas mixture. The addition of nitrogen gas is effective in improving the cited properties of the silicon oxide layers without altering the basic properties of the deposition process or degrading the other desirable properties of the silicon oxide layers in any substantial manner.

9 Claims, 2 Drawing Sheets

PE-TEOS PROCESS

BACKGROUND OF THE INVENTION

(1) Field of the Invention

The invention relates to a method of deposition of silicon oxide layers in the fabrication of integrated circuits, and more particularly to a method of oxide deposition resulting in improved uniformity and moisture resistance in the manufacture of integrated circuits.

(2) Description of the Prior Art

In the fabrication of semiconductor integrated circuits, and more specifically those in which silicon is the semiconductor, various uses are made of layers of insulating material. For example, such insulating layers are employed as electrical insulation between conducting layers such as electrical interconnection patterns. Another example is the insulion between the polysilicon gate electrode layers and their various interconnections. Still another example is the use of insulating layers to cover over the circuit structure before final provision of electrical contacts. This latter application is referred to as the passivation layer, For these specific and other applications, use is commonly made of chemically-deposited layers of silicon oxide in which the chemical reaction providing the deposited layer of silicon oxide is often enhanced by an electrical plasma sustained in the reactive gases by a radiofrequency power input.

The silicon oxide layers deposited by plasma-enhanced chemical vapor deposition from silicon-containing gaseous compounds and oxygen afford better coverage over surface topographical features such as steps and edges, but are of inferior quality with respect to etching behaviour and moisture resistance compared to silicon oxide layers obtained from mixtures of silane ($SiH_4$) and oxygen. Such silicon oxide layer properties as etch rate, moisture resistance, and mechanical stress are critical in the fabrication of semiconductor integrated circuit devices, especially with respect to manufacturing yield and device reliability. The method of using vapors consisting of silicon-containing compounds such as tetraethoxysilane in plasma-enhanced chemical vapor deposition processes in conjunction with oxygen to deposit silicon oxide layers is described in "SILICON PROCESSING FOR THE VLSI ERA" by S. Wolf, published by Lattice Press, Sunset Beach, Calif. 1990 p. 194–199, but the quality of such silicon oxide layers is generally not as satisfactory with respect to etch rate, moisture resistance, and mechanical stress as are those obtained from silane and oxygen.

SUMMARY OF THE INVENTION

A principal object of the present invention is to provide an improved method of deposition of silicon oxide layers employed in the fabrication of integrated circuits. The improved method of fabrication and manufacture of such oxide layers results in higher yield and greater reliability of integrated circuit devices.

In accordance with the objects of this invention, an improvement in the properties of etch rate, chemical resistance, and mechanical stress of silicon oxide layers obtained by plasma-enhanced chemical vapor deposition from mixtures of reactive gases such as tetraethoxysilane and oxygen is achieved by adding nitrogen gas to the reactive mixture. The addition of nitrogen gas is effective in improving the properties of the silicon oxide layers without substantially altering the basic process of plasma-enhanced chemical vapor deposition or degrading the other desirable properties of the oxide layers in any substantial manner.

BRIEF DESCRIPTION OF THE DRAWINGS

In the accompanying drawings forming a material part of this description, there is shown.

DESCRIPTION OF THE PREFERRED EMBODIMENT

Figure 1:
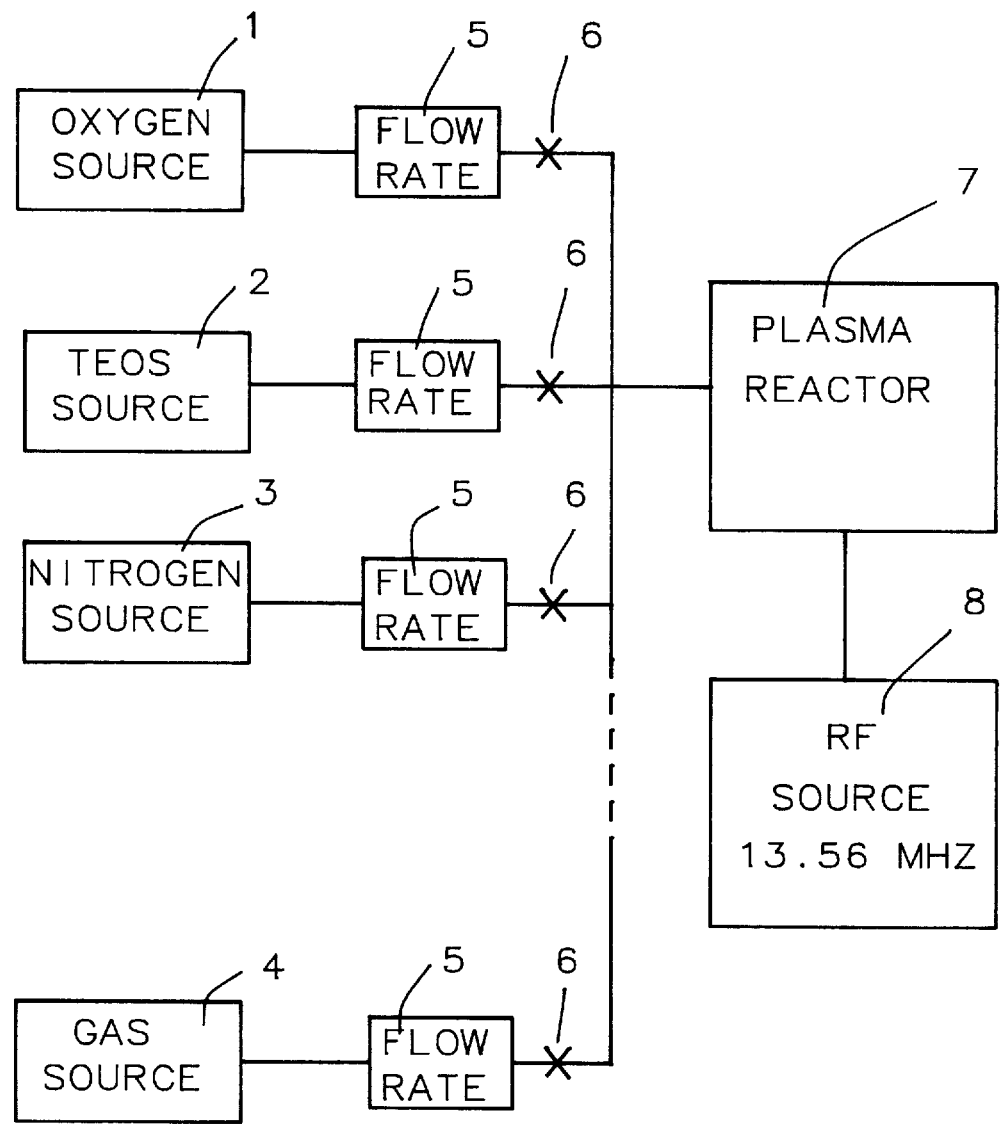
FIG. 1 schematically illustrates a process flow chart of the invention for the deposition of silicon oxide layers by plasma-enhanced reaction of various gases in a plasma reactor.

Referring now to FIG. 1, a schematic diagram of the oxygen gas source 1 and tetraethoxysilane (TEOS) vapor source 2 is shown along with sources of additional gases such as nitrogen 3 or other gases 4 in a manifold of a plasma reactor used in the deposition of silicon oxide layers for the fabrication of integrated circuits. By suitable setting of control valves 5 the desired gas flow rates may be set and monitored by gas flowmeters 6. The combined reactive gases are led into a plasma reactor vessel 7 in which an electrical plasma is sustained by microwave length electromagnetic energy at a frequency of 13.56 megaHertz (MHz) 8 to bring about the deposition of a silicon oxide layer on the substrate. In the fabrication of semiconductor integrated circuits, the substrate is typically a silicon wafer. In the prior art, the silicon oxide layers are deposited from a mixture of oxygen and TEOS gases at a typical pressure of 8.2 millimeters of mercury (mm Hg). The flow rates of the reactive gases measured in standard cubic centimeters per minute (SCCM) are typically 400 to 800 SCCM for oxygen and 600 to 1000 SCCM for tetraethoxysilane for a total of about 1000 to 1800 SCCM.

Figure 2:
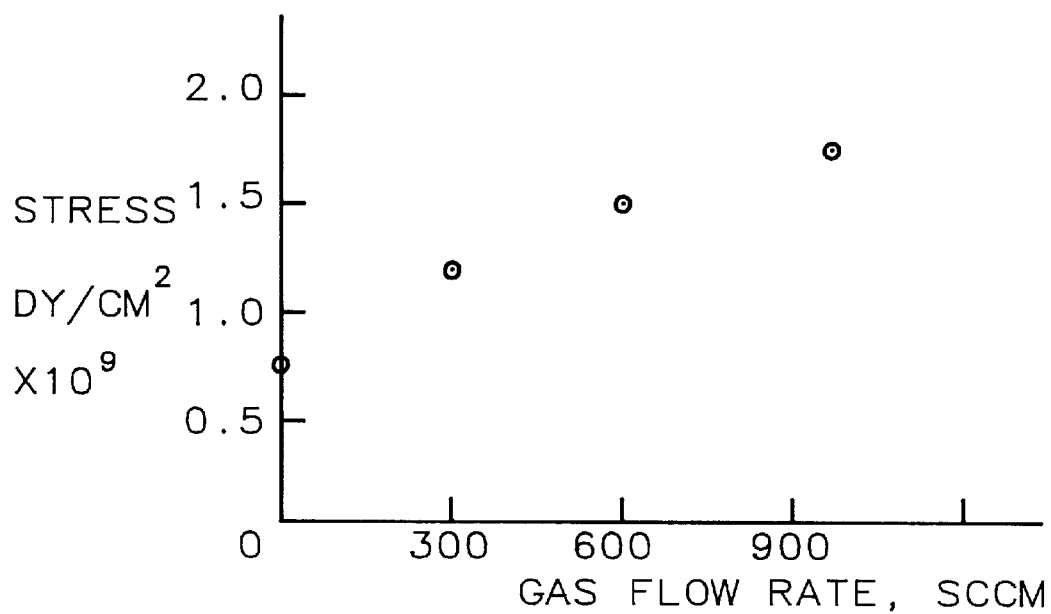
FIG. 2 graphically illustrates the improvement in mechanical stress in silicon oxide layers deposited in the invention with addition of nitrogen gas to the reactive gas mixture.

Referring again to FIG. 1, the present invention employs the addition of nitrogen gas to the reactive gas mixture to produce an improvement in the properties of the deposited silicon oxide layer. The addition of nitrogen gas at flow rates of between about 300 to 900 SCCM, which is between about 20% and 65% of the total reactive gas flow rate, results in increased chemical resistance and reduced etch rates for the oxide layers which is desirable in improving ease of manufacture, yield, and reliability of the integrated circuit devices. In particular, referring now to FIG. 2, the addition of nitrogen as already described also results in an increased compressive stress in the deposited silicon oxide layers. This is desirable in reducing the tendency of the oxide layers to form cracks, which leads to concerns about manufacturing yield and subsequent integrated circuit device reliability.

In addition to improvements already cited, the addition of nitrogen gas to the reactive gas mixture improves the uniformity of the silicon oxide layers by decreasing the incidence of hillocks, which are raised regions on the oxide surface. The moisture resistance of the silicon oxide layers is also increased by the addition of nitrogen gas to the reactive gas mixture. The improvements cited in the present invention are accompanied by no significant changes or degradations of other properties of the silicon oxide layers which might be disadvantageous. For example, the refractive index of the silicon oxide layers produced by the teaching of this invention is substantially the same as that produced in the prior art. Thus there appears to be no significant formation of chemical bonds such as silicon-nitrogen (Si—N) which could lead to significant alteration in the properties of the deposited silicon oxide layer. The cited improvements in the properties of the silicon oxide layer appear to result from a densification of the oxide layer due to the incorporation of nitrogen mechanically rather than chemically within the oxide structure.

EXAMPLES

The following examples are given to show the important features of the invention and to aid in the understanding thereof and variations may be made by one skilled in the art without departing from the spirit and scope of the invention.

Layers of silicon oxide were deposited by plasma-enhanced reaction of oxygen and TEOS onto silicon wafers measuring 15 centimeters (cm) in diameter. The control sample was deposited in the absence of any input flow of nitrogen gas, while the experimental samples were deposited from gas mixtures containing specific amounts of nitrogen gas. All samples were deposited under the same conditions of total pressure and power input, which are shown in Table 1 along with the results.

TABLE I

| Nitrogen gas flow rate, SCCM | Uniformity % | Wet etch rate cm/min (E-8) | Mechanical dynes/cm2 (E9) |
|---|---|---|---|
| 0 | 1.210 | 2066 | −0.706 |
| 300 | 1.001 | 1838 | −1.207 |
| 600 | 0.916 | 1746 | −1.485 |
| 900 | 0.803 | 1613 | −1.690 |

Tetraethoxysilane/oxygen gas flow rate 800/600 SCCM and pressure 8.2 mm Hg at plasma reactor input power of 675 watts all runs.

From the results in Table 1, it is clear that improved uniformity, decreased wet etch rate, and increased compressive mechanical stress are achieved by the addition of nitrogen gas. Furthermore, the improvements in oxide layer properties increase with increasing amounts of added nitrogen gas over the range of the experiment. In particular, the increase in compressive mechanical stress is seen to approach a limiting value at the highest nitrogen gas flow rate, as is shown graphically in FIG. 2. The upper limit for the flow rate of the added nitrogen gas under these conditions is about 1200 SCCM. The uniformity measurements were taken across a single silicon wafer, and represent the standard deviation of 49 points of measurement compared to the average surface profile in terms of a percentage.

While the invention has been particularly shown and described with reference to the preferred embodiment thereof, it will be understood by those skilled in the art that various changes in form and details may be made without departing from the spirit and scope of the invention.

What is claimed is:

1. A method of depositing a dielectric layer on a semiconductor substrate in a plasma reactor, comprising:

providing a mixture of oxygen (O2) gas and tetraethoxysilane vapor;

adding nitrogen gas to said mixture; and establishing a plasma in said plasma reactor to complete the deposition of said dielectric layer, wherein nitrogen is mechanically incorporated but not chemically bound into said dielectric layer during deposition of said dielectric layer.

2. The method of claim 1 wherein the nitrogen gas is added at a flow rate of between about 20% to 65% of combined flow rates of the oxygen gas and tetraethoxysilane vapor.

3. The method of claim 1 wherein the nitrogen gas is added at a flow rate of between about 300 to 900 SCCM while the oxygen gas is added at a flow rate of between about 400 to 800 SCCM and the tetraethoxysilane gas is added at a flow rate of between about 600 to 1000 SCCM.

4. The method of claim 1 of depositing silicon oxide layers in a plasma reactor operating at an input plasma power of between about 500 to 800 watts at a frequency of 13.56 MHZ.

5. The method of claim 4 wherein the nitrogen gas is added at a flow rate of between about 20% to 65% of the combined total gas flow rate of the oxygen/tetraethoxysilane gas mixture.

6. The method of claim 4 wherein the nitrogen gas is added at a flow rate varying between about 300 to 900 SCCM at a combined total gas flow rate of the oxygen/tetraethoxysilane gas mixture of about 1400 SCCM.

7. A method of depositing a dielectric layer on a semiconductor substrate in a plasma-enhanced process comprising:

providing a reactive gas mixture of oxygen and tetraethoxysilane;

adding non-reactive nitrogen gas to said reactive gas mixture;

introducing said gas mixture into a plasma reactor; and operating said plasma reactor at a typical plasma power input of between about 600 to 750 watts at a typical total gas pressure of between about 7.0 to 9.0 mm Hg, to complete the deposition of said dielectric layer, wherein nitrogen is mechanically incorporated but not chemically bound into said dielectric layer during deposition of said dielectric layer.

8. The method of claim 7 wherein the nitrogen gas is added at a flow rate of between about 20% to 65% of the combined total gas flow rate of the oxygen/tetraethoxysilane gas mixture.

9. The method of claim 7 wherein the oxygen gas is added at a flow rate of between about 400 to 800 SCCM; the tetraethoxysilane gas is added at a flow rate of between about 600 to 1000 SCCM; and the nitrogen gas is added at a flow rate of between about 300 to 900 SCCM.

* * * * *